United States Patent
Gondhalekar et al.

(10) Patent No.: US 6,682,603 B2
(45) Date of Patent: Jan. 27, 2004

(54) SUBSTRATE SUPPORT WITH EXTENDED RADIO FREQUENCY ELECTRODE UPPER SURFACE

(75) Inventors: Sudhir Gondhalekar, Fremont, CA (US); Dongqing Li, Santa Clara, CA (US); Canfeng Lai, Fremont, CA (US); Zhengquan Tan, Cupertino, CA (US); Steve H. Kim, Union City, CA (US); Alexander Veyster, Mountain View, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/141,391

(22) Filed: May 7, 2002

(65) Prior Publication Data
US 2003/0211757 A1 Nov. 13, 2003

(51) Int. Cl.$^7$ .............................................. C23C 16/00
(52) U.S. Cl. .................. 118/728; 118/723 R; 118/723 E
(58) Field of Search ............................ 118/728, 723 R, 118/723 E (56) References Cited

U.S. PATENT DOCUMENTS

| | | | |
|---|---|---|---|
| 5,238,499 A | 8/1993 | van de Ven et al. | |
| 5,374,594 A | 12/1994 | van de Ven et al. | |
| 5,761,023 A | 6/1998 | Lue et al. | |
| 5,841,623 A | 11/1998 | Denison et al. | |
| 6,175,485 B1 | 1/2001 | Krishnaraj et al. | |
| 6,254,745 B1 * | 7/2001 | Vukovic | 204/298.06 |
| 6,310,755 B1 | 10/2001 | Kholodenko et al. | |
| 6,364,958 B1 * | 4/2002 | Lai et al. | 118/728 |
| 6,383,954 B1 * | 5/2002 | Wang et al. | 438/789 |
| 6,416,634 B1 * | 7/2002 | Mostovoy et al. | 204/192.12 |
| 2002/0162629 A1 * | 11/2002 | Jeon et al. | 156/345.35 |

OTHER PUBLICATIONS

Olson et al., "Characterization, modeling, and design of an electrostatic chuck with improved wafer temperature uniformity" *Rev. Sci. Instrum.* (1995) 66(2):1108–1114.

* cited by examiner

Primary Examiner—Alexander Ghyka
(74) Attorney, Agent, or Firm—Townsend and Townsend and Crew (57) ABSTRACT

A substrate support utilized in high-density plasma chemical vapor deposition (HDP-CVD) processing functions as a radio frequency (RF) electrode (e.g., a bias RF cathode). An upper surface of the substrate support has a central upper surface portion and a peripheral upper surface portion, with the peripheral upper surface portion recessed relative to the central upper surface portion. The upper surface of the support extends beyond an outer edge of the substrate when the substrate is positioned on the substrate support. This extension in the support upper surface may enhance process performance by reducing electric field edge effects, as well as by improving directional distribution of ions traveling to the substrate. Since the peripheral upper surface portion is recessed relative to the central upper surface portion, a detachable shield can be disposed on the peripheral upper surface portion for preventing undesirable deposition on, or chemical attack of, the peripheral upper surface is portion, without interfering with positioning of the substrate.

17 Claims, 6 Drawing Sheets

SUBSTRATE SUPPORT WITH EXTENDED RADIO FREQUENCY ELECTRODE UPPER SURFACE

BACKGROUND OF THE INVENTION

High-density plasma chemical vapor deposition (HDP-CVD) methods, and associated apparatus are frequently used during manufacturing of semiconductor and liquid crystal display devices to deposit dielectric and polysilicon layers on a substrate. Dielectric layers deposited using such methods and apparatus include, for example, shallow trench isolation (STI) dielectric layers, pre-metal dielectric layers and inter-metal dielectric (IMD) layers.

The apparatuses used during HDP-CVD processing typically include a chamber and a substrate support located therein, upon which a substrate is securely positioned. During HDP-CVD processing, a radio frequency (RF) electric field is applied between an RF electrode portion of the substrate support and the chamber to generate a plasma within the chamber and/or bias the plasma towards the substrate.

A common type of substrate support is the electrostatic chuck, although vacuum chucks and clamped chucks can also be employed in HDP-CVD methods and apparatus as substrate supports. Electrostatic chucks employ electrostatic force to securely hold a substrate and are also frequently adapted to control the temperature of the substrate using a heat exchanging fluid. Vacuum chucks employ a vacuum force to hold a substrate. Such a vacuum force can be applied to the backside of a substrate via, for example, radial or annular grooves provided in an upper surface of the vacuum chuck.

Substrate supports employed in HDP-CVD methods and apparatus for the manufacturing of semiconductor devices are adapted to securely hold a semiconductor wafer of predetermined diameter (e.g., a semiconductor wafer with a diameter of 200 mm or 300 mm). The diameter of such conventional chucks is typically equal to, or slightly less than, the predetermined diameter of the semiconductor wafer. As a result, the semiconductor wafer will completely cover or extend beyond the upper surface of the electrostatic chuck. This arrangement prevents undesirable deposition on, or chemical attack of, the upper surface of the conventional chuck (e.g., a conventional electrostatic chuck or conventional vacuum chuck). A further description of substrate supports and their associated apparatus, including electrostatic chucks, is available in commonly assigned U.S. Pat. No. 5,761,023, which is hereby fully incorporated by reference for all purposes.

Two performance parameters for some HDP-CVD processes include: (i) the ability to uniformly deposit a layer of material across the center and edge portions of a substrate; and (ii) the ability to deposit a layer that will completely fill a narrow and high aspect ratio gap (e.g., a narrow shallow trench with an aspect ratio of 4:1 or greater) during semiconductor manufacturing. Some conventional HDP-CVD methods and apparatus, including those apparatus employing conventional chucks, may experience differing performance (e.g., uniformity performance and gap fill performance) near the outer edge of a substrate relative to its center.

Accordingly, methods and apparatus for HDP-CVD processing that improve deposition uniformity and gap fill performance across an entire substrate are desirable.

BRIEF SUMMARY OF THE INVENTION

Embodiments in accordance with the present invention provide apparatuses and methods for supporting a substrate and applying an electrical field to a supported substrate during semiconductor processing. In particular, embodiments of the present invention provide a support structure having an upper surface with a peripheral portion that extends beyond an edge of the supported substrate. Extension of the upper support surface in accordance with embodiments of the present invention repositions to beyond the substrate edge, changes in direction and magnitude of the electric field associated with the edge of the electrode. Methods and apparatuses for supporting a substrate in accordance with the present invention are particularly suited for use in high-density plasma chemical vapor deposition (HDP-CVD) applications, wherein unwanted edge effects such as uneven gap filling at the substrate edge relative to the substrate center can be substantially reduced.

In accordance with one exemplary embodiment of the present invention, a substrate support (e.g., an electrostatic chuck) for a semiconductor fabrication apparatus comprises a conductive portion for providing an electrical field to a supported substrate. The support further includes a dielectric upper surface including a central upper surface portion configured to contact a center of the substrate, and a peripheral upper surface portion recessed from a plane of the supported substrate by a distance of 3 mm or less. The peripheral upper surface portion extends beyond an edge of the supported substrate to provide a homogenous electrical field at an edge of the substrate relative to a center of the substrate.

is adapted to process a substrate and includes an upper surface. The upper surface of the substrate support comprises a central upper surface portion, where a substrate is positioned, and a peripheral upper surface portion, with the peripheral upper surface portion disposed lower than the central upper surface portion. The upper surface extends beyond an outer edge of the substrate when the substrate is positioned on the substrate support.

Extension of the upper surface of the support beyond the edge of the substrate may enhance process performance (e.g., HDP-CVD gap fill performance) for narrow high aspect ratio (>4:1) trenches by reducing electric field edge effects, as well as by improving the directional distribution of ions traveling to the substrate. Furthermore, since the peripheral upper surface portion is recessed relative to the central upper surface portion, a shield structure can be disposed on the peripheral upper surface portion for preventing undesirable deposition on, chemical attack of, or grounding difficulties with, the peripheral upper surface portion without interfering with positioning the substrate on the central upper surface portion.

Also provided by the present invention is a method for depositing a layer on a substrate. The method includes positioning a substrate (e.g., a 200 mm or 300 mm semiconductor wafer) on a substrate support. An upper surface of the substrate support has a central upper surface portion and a peripheral upper surface portion, with the peripheral upper surface portion being disposed lower than the central upper surface portion. The upper surface of the substrate support extends beyond an outer edge of the substrate when the substrate is positioned thereon. After positioning the substrate, a layer is deposited on the substrate using a high density plasma chemical vapor deposition technique.

An embodiment of a method for improving center-to-edge gap fill uniformity of material formed on a substrate by high density plasma chemical vapor deposition (HDP-CVD) comprises providing a substrate support within a processing chamber, the substrate support including an upper surface having a recessed peripheral portion. A substrate is disposed upon the substrate support such that the peripheral recessed portion extends beyond an outer edge of the substrate. An RF bias is applied to the substrate support to create an electric field over the substrate support, the electric field exhibiting a uniform direction and magnitude over the substrate edge relative to a center of the substrate.

An embodiment of an apparatus for performing high density plasma chemical vapor deposition of material upon a substrate comprises a chamber defining a plasma processing region therein, the chamber including a bottom, a side wall, and a dome disposed on top of the side wall, the dome having a dome top and having a side portion defining a chamber diameter. The apparatus further comprises a vacuum system including a pump for evacuating the chamber, a processing gas source in fluid communication with the chamber, a top RF coil disposed above the dome top, a side RF coil disposed adjacent the side portion of the dome, and a substrate bias source. A substrate support is positioned within the processing chamber. The substrate support includes a conductive portion configured to receive a bias from the substrate bias source and to apply an electrical field over a supported substrate. The substrate support also includes a dielectric upper surface including a central upper surface portion configured to contact a center of the substrate, and a peripheral upper surface portion recessed from a plane of the supported substrate by a distance of 3 mm or less, the peripheral upper surface portion extending beyond an edge of the supported substrate, to provide a homogenous electrical field at an edge of the substrate relative to a center of the substrate.

A better understanding of the features and advantages of the present invention will be obtained by reference to the following detailed description that sets forth illustrative embodiments, in which the principles of the invention are utilized, and the accompanying drawings.

DESCRIPTION OF EXEMPLARY EMBODIMENTS OF THE INVENTION

Figure 1:
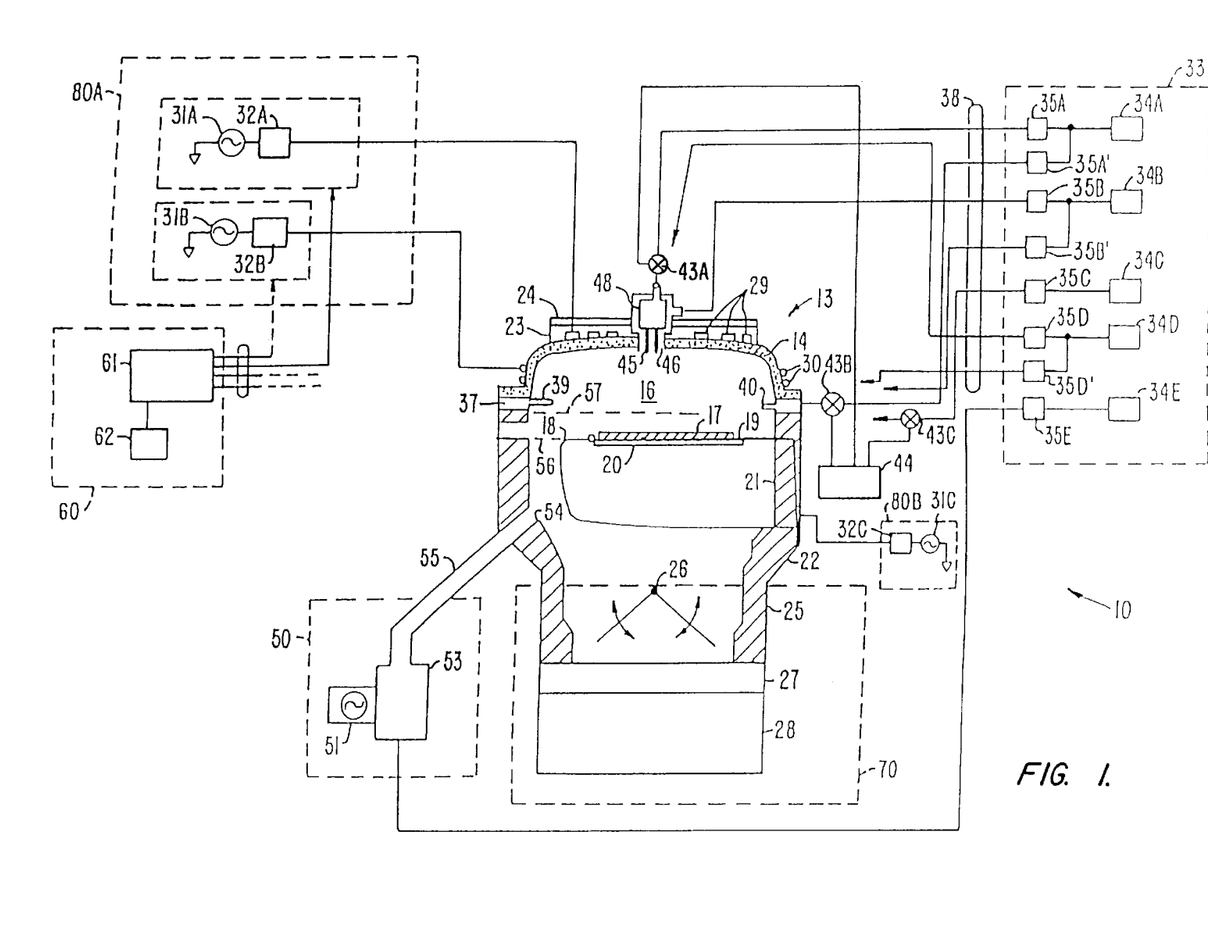
FIG. 1 is a simplified diagram of an embodiment of a high density plasma chemical vapor deposition (HDP-CVD) according to the present invention.

FIG. 1 illustrates one embodiment of a high density plasma chemical vapor deposition (HDP-CVD) system 10 in which a dielectric layer can be deposited. System 10 includes a chamber 13, a vacuum system 70, a source plasma system 80A, a bias plasma system 80B, a gas delivery system 33, and a remote plasma cleaning system 50.

The upper portion of chamber 13 includes a dome 14, which is made of a ceramic dielectric material, such as aluminum oxide or aluminum nitride. Dome 14 defines an upper boundary of a plasma processing region 16. Plasma processing region 16 is bounded on the bottom by the upper surface of a substrate 17 and a substrate support 18.

A heater plate 23 and a cold plate 24 surmount, and are thermally coupled to, dome 14. Heater plate 23 and cold plate 24 allow control of the dome temperature to within about ±10°C. over a range of about 100°C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

Generally, exposure to the plasma heats a substrate positioned on substrate support 18. Substrate support 18 includes inner and outer passages (not shown) that can deliver a heat transfer gas (sometimes referred to as a backside cooling gas) to the backside of the substrate.

The lower portion of chamber 13 includes a body member 22, which joins the chamber to the vacuum system. A base portion 21 of substrate support 18 is mounted on, and forms a continuous inner surface with, body member 22. Substrates are transferred into and out of chamber 13 by a robot blade (not shown) through an insertion/removal opening (not shown) in the side of chamber 13. Lift pins (not shown) are raised and then lowered under the control of a motor (also not shown) to move the substrate from the robot blade at an upper loading position 57 to a lower processing position 56 in which the substrate is placed on a substrate receiving portion 19 of substrate support 18. Substrate receiving portion 19 includes an electrostatic chuck 20 that secures the substrate to substrate support 18 during substrate processing. In a preferred embodiment, substrate support 18 is made from a conductive metal coated with an aluminum oxide or aluminum nitride ceramic material. Further details of substrate support 18 are provided below with respect to FIGS. 3–6.

Vacuum system 70 includes throttle body 25, which houses throttle valve 26 and is attached to gate valve 27 and turbo-molecular pump 28. It should be noted that throttle body 25 offers minimum obstruction to gas flow, and allows symmetric pumping, as described in co-pending, co-assigned U.S. patent application Ser. No. 08/574,839, filed Dec. 12, 1995, and which is incorporated herein by reference. Gate valve 27 can isolate pump 28 from throttle body 25, and can also control chamber pressure by restricting the exhaust flow capacity when throttle valve 26 is fully open. The arrangement of the throttle valve, gate valve, and turbo-molecular pump allow accurate and stable control of chamber pressures from between about 1 milli-Torr to about 2 Torr.

The source plasma system 80A includes a top coil 29 and side coil 30, mounted on dome 14. A symmetrical ground shield (not shown) reduces electrical coupling between the coils. Top coil 29 is powered by top source RF (SRF) generator 31A, whereas side coil 30 is powered by side SRF generator 31B, allowing independent power levels and frequencies of operation for each coil. This dual coil system allows control of the radial ion density in chamber 13, thereby improving plasma uniformity. Side coil 30 and top coil 29 are typically inductively driven, which does not require a complimentary electrode. In a specific embodiment, the top source RF generator 31A provides up to 5,000 watts of RF power or higher at nominally 2 MHz and the side source RF generator 31B provides up to 5,000 watts of RF power or higher at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 80B includes a bias RF (BRF) generator 31C and a bias matching network 32C. The bias plasma system 80B capacitively couples substrate portion 17 to body member 22, which act as complimentary electrodes. The bias plasma system 80B serves to enhance the transport of plasma species (e.g., ions) created by the source plasma system 80A to the surface of the substrate. In a specific embodiment, bias RF generator provides up to 5,000 watts of RF power or higher at 13.56 MHz.

RF generators 31A and 31B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition. Other measures may also help stabilize a plasma. For example, the RF control circuit can be used to determine the power delivered to the load (plasma) and may increase or decrease the generator output power to keep the delivered power substantially constant during deposition of a layer.

Figure 2:
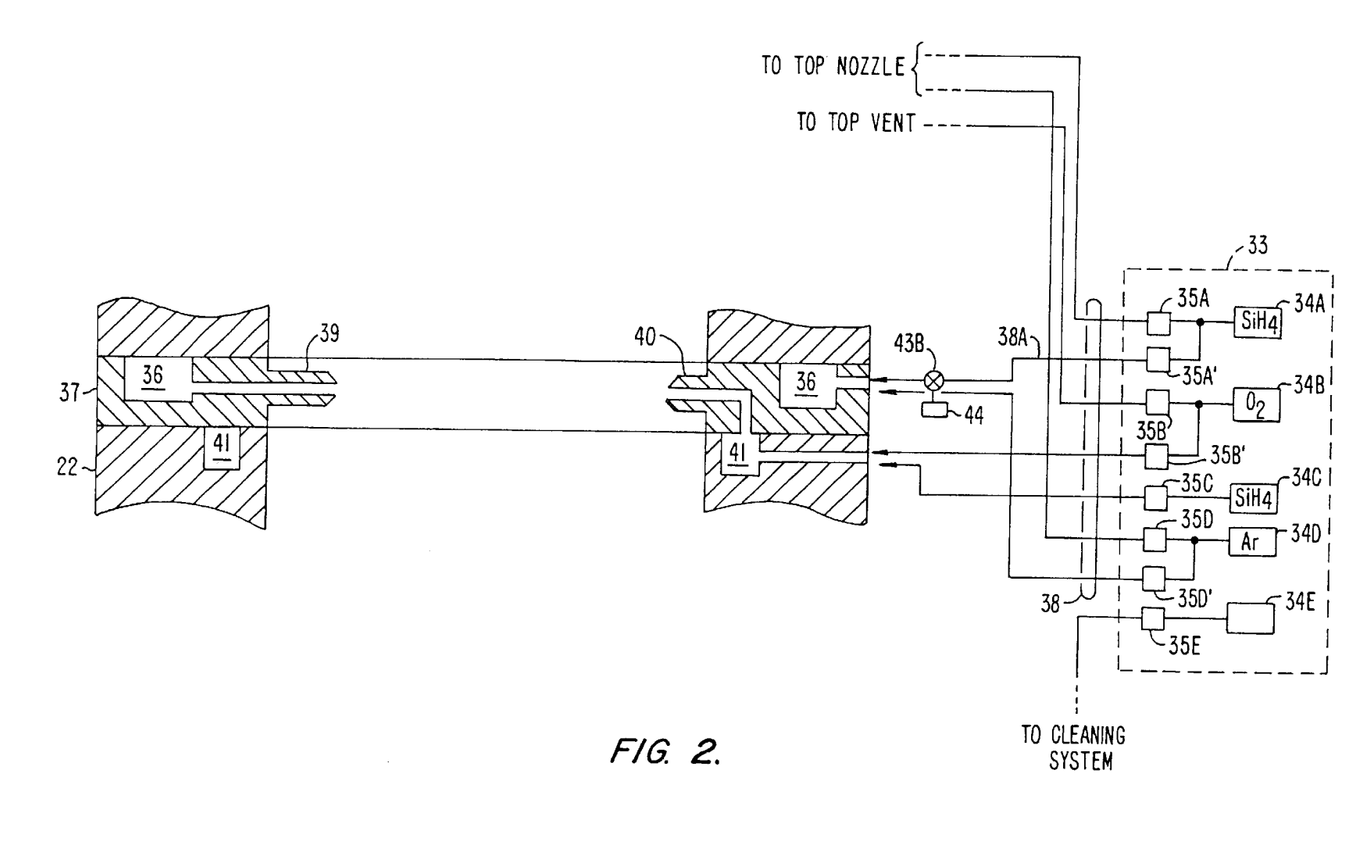
FIG. 2 is a simplified cross-sectional diagram of a gas ring that may be used in conjunction with exemplary HDP-CVD system according to the present invention.

A gas delivery system 33 provides gases from several sources, 34A–34F chamber for processing the substrate via gas delivery lines 38 (only some of which are shown). As would be understood by a person of skill in the art, the actual sources used for sources 34A–34F and the actual connection of delivery lines 38 to chamber 13 varies depending on the deposition and cleaning processes executed within chamber 13. Gases are introduced into chamber 13 through a gas ring 37 and/or a top nozzle 45. FIG. 2 is a simplified, partial cross-sectional view of chamber 13 showing additional details of gas ring 37.

In one embodiment, first and second gas sources, 34A and 34B, and first and second gas flow controllers,35A' and 35B', provide gas to ring plenum 36 in gas ring 37 via gas delivery lines 38 (only some of which are shown). Gas ring 37 has a plurality of gas nozzles 39 (only one of which is shown for purposes of illustration) that provides a uniform flow of gas over the substrate. Nozzle length and nozzle angle may be changed to allow tailoring of the uniformity profile and gas utilization efficiency for a particular process within an individual chamber. In a preferred embodiment, gas ring 37 has 12 gas nozzles 39 made from an aluminum oxide ceramic.

Gas ring 37 also has a plurality of gas nozzles 40 (only one of which is shown), which in a preferred embodiment are co-planar with and the same in length as source gas nozzles 39, and in one embodiment receive gas from body plenum 41. Gas nozzles 39 and 40 are not fluidly coupled in some embodiments it is desirable not to mix gases before injecting the gases into chamber 13. In other embodiments, gases may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. Additional valves, such as 43B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 43B, to isolate chamber 13 from delivery line 38A and to vent delivery line 38A to vacuum foreline 44, for example. As shown in FIG. 1, other similar valves, such as 43A and 43C, may be incorporated on other gas delivery lines. Such 3-way valves may be placed as close to chamber 13 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 1, chamber 13 also has top nozzle 45 and top vent 46. Top nozzle 45 and top vent 46 allow independent control of top and side flows of the gases, which improves film uniformity and allows fine adjustment of the film's deposition and doping parameters. Top vent 46 is an annular opening around top nozzle 45. In one embodiment, first gas source 34A supplies source gas nozzles 39 and top nozzle 45. Source nozzle MFC 35A' controls the amount of gas delivered to source gas nozzles 39 and top nozzle MFC 35A controls the amount of gas delivered to top gas nozzle 45. Similarly, two MFCs 35B and 35B' may be used to control the flow of oxygen to both top vent 46 and oxidizer gas nozzles 40 from a single source of oxygen, such as source 34B. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

In the embodiment shown in FIGS. 1 and 2, remote microwave-generated plasma cleaning system 50 is provided to periodically clean deposition residues from chamber components. The cleaning system includes a remote microwave generator 51 that creates a plasma from a cleaning gas source 34E (e.g., molecular fluorine, nitrogen trifluoride, other fluorocarbons or equivalents) in reactor cavity 53. The reactive species resulting from this plasma are conveyed to chamber 13 through cleaning gas feed port 54 via applicator tube 55. The materials used to contain the cleaning plasma (e.g., cavity 53 and applicator tube 55) must be resistant to attack by the plasma. The distance between reactor cavity 53 and feed port 54 should be kept as short as practical, since the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 20, do not need to be covered with a dummy wafer or otherwise protected, as may be required with an in situ plasma cleaning process.

Figure 3:
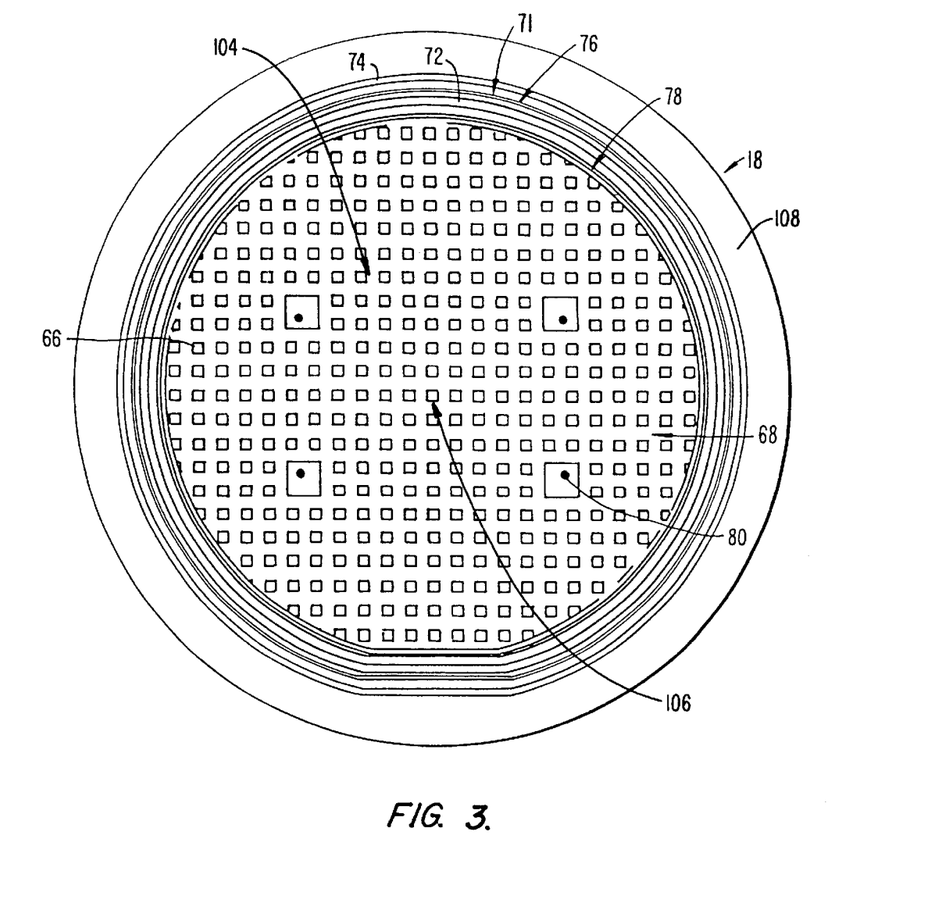
FIG. 3 is a simplified plan view of one embodiment of a substrate support in accordance with the present invention.

FIG. 3 is a simplified plan view of one embodiment of an electrostatic chuck 20 according to the present invention. A number of grooves are provided in the upper surface 104 of support 18 to form a large number of protrusions 66. A central zone 68 of these protrusions is separated from a peripheral zone 71 by a seal 72. Seal 72 is simply an area which has not had grooves formed in it to provide protrusions, thus forming a solid surface to provide essentially uniform contact with the wafer. An outer seal 74 provides a barrier to minimize leakage of helium gas into the chamber.

Helium gas is inserted into periphery zone 71 through a ring 76 which is a groove having a series of holes in it which receive high-pressure helium into this zone from a high-pressure helium line. An inner ring 78 allows a lower pressure gas to the central zone 68 from a low-pressure helium line. In operation, after establishing an initial low helium pressure in central zone 68, helium ring 78 typically will be removing helium gas leaking through seal area 72 to maintain the desired low pressure helium. In this fashion, the seal area functions as a baffle so as to bifurcate helium gas inserted into periphery zone 71 so that a portion of the same flows over seal area 72 and into helium ring 78. This creates spaced-apart pressure differentials in the helium gas, i.e., a high-pressure in ring 76 and a low-pressure in central zone 68. The high-pressure helium gas allows a greater amount of thermal transfer than the low-pressure helium gas; thus, a heat transfer gradient is defined in which a greater amount of heat is transferred from a portion of a wafer disposed adjacent to the periphery zone 71 than is transferred between a portion of a wafer disposed adjacent to the central zone 68. In an optional embodiment, vacuum holes 81, which may be lift pin holes, can be used to pump out the gas in the central zone using a vacuum line to further lower the pressure in the central zone. Optionally, additional vacuum holes could be added.

Helium groove 78 is preferably positioned near seal area 72. By positioning it as close as possible, the desired heat transfer can be achieved. The high pressure gas is thus contained in a narrow region by the periphery. If the high pressure gas extended too far toward the center of the wafer, the cooler center would become even cooler, partially offsetting the reduction in heat differential provided by the high pressure gas. Thus, the heat transfer gradient is a function of a magnitude of a separation of the spaced-apart pressure differential.

In operation, for heating the wafer, low-pressure helium (1–15 torr) is provided into the central zone 68, and high-pressure helium (1–20 torr) is provided to peripheral zone 71. The higher pressure helium in the peripheral zone provides heat transfer at the periphery of the wafer.

In one embodiment, the seals are made of the same ceramic coating as the remainder of the top of electrostatic chuck 20. Such a ceramic coating has small interstices, and thus the seal areas do not provide a perfect seal. In addition, the substrate or wafer will have some backside roughness, and may have more roughness than the substrate support. Accordingly, the seal area should have sufficient width to prevent significant leakage of helium from one area to the other. It has been determined by testing that for a ceramic covered electrostatic chuck with the pressure ranges set forth above, that a seal width of 1/10 inch, or 100 mils, is effective. Preferably, the seal width is in the range of 50 to 300 mils. For the outer seal 74, it is desirable to minimize the width because the area of the wafer above this seal will not have the benefit of the heat conduction from the high-pressure helium. At the same time, the seal must be wide enough to prevent significant leakage of helium into the chamber which could affect the reaction in the chamber. The same 100 mil width has been found effective, with an optimum seal width being in the range of 50 to 300 mils. Alternate widths may be appropriate for different materials and smoothness of the substrate support and substrate. For example, if a polymer film, such as KAPTON™, available from many well-known suppliers, is used, a small width can be achieved because of its compliancy.

A preferred heat transfer gas is helium because it is inert and relatively inexpensive. Alternately, argon, oxygen, $CF_4$, or other gases could be used, or a mixture of gases may be used. A mixture could be used, for instance, to give additional pressure control capabilities. The particular gas could be chosen to be compatible with the chemical process in the chamber so that any leaking gas will have minimal effect on the chemical reactions. For example, in an etching reaction using fluorine as an etching species, it may be desirable to use $CF_4$ as the backside heat transfer gas.

Because heat conduction occurs primarily through the helium gas, it is desirable to minimize the size and number of the protrusions and seal areas for this purpose. Thus, there should be less contact area than non-contact area over the area of the substrate. On the other hand, the seals are required to prevent gas leakage and the protrusions must be of sufficient size and spacing to mechanically support the wafer. In addition there are other factors to be optimized. The height of the protrusions, which determine the gap between the substrate and the substrate support between the protrusions, must be sufficient to allow the gas to quickly become distributed throughout the zones without affecting a process start up time. Typically, this must be on the order of a few seconds, and preferably the gas is distributed in 10 seconds or less.

For optimum heat transfer, the gap should be small enough so that heat transfer primarily occurs by molecules traveling directly from the substrate to the substrate support without colliding with another gas molecule, giving free molecular heat transfer. Thus, the gap should be less than the mean free path of the gas (or the average free path if a mixture of gases is used). The mean free path is a function of the pressure of the gas and the molecular collisional cross-section. Where a variety of pressures will be used, the mean free path will vary. In a preferred embodiment, the mean free path of the maximum pressure to be applied is used to determine the gap dimension.

In addition, the ratio of the gap to the overall dielectric thickness must be kept small to avoid local anomalies on the substrate. If this ratio is significant, the equivalent capacitance will vary significantly between the spaces and the protrusions, applying a significantly different electric field to the substrate. This different field can affect the chemical process, causing non-uniformities in the film that is being deposited, etched, doped, or undergoing other property transformations. Some difference will necessarily be present, but it is desirable to minimize this. The significance of the ratio also varies depending on the dielectric material, in particular the difference between the dielectric constant of the material and the heat transfer gas (essentially one). The closer the two dielectric constants, the less the concern with a larger gap.

Another concern in setting the gap size is to avoid having a plasma generated with the heat transfer gas between the substrate support and the backside of the wafer. It is believed that this would begin to be a concern if the gap size were several times the mean free path of the heat transfer gas.

For one embodiment of an electrostatic chuck, the thickness of the ceramic coating is on the order of 7–10 mils. If KAPTON™ is used, a thickness of 1–2 mils may be used. Ideally, for chucking purposes, the dielectric is as thin as possible within the limits of maintaining manufacturing consistency and avoiding dielectric breakdown. The mean free path of helium at the pressures for the two zones described above is about 1–5 mils (at very high pressures, the mean free path may be less than one). Accordingly, protrusion heights of 0.7–1.2 mils have been chosen, tested, and found effective. This gives a gap less than the mean free path of helium at the desired pressures. Preferably, the gap is less than twice the mean free path of the heat transfer gas at the pertinent pressures, and more preferably less than the mean free path.

The spacing between the protrusions is as large as possible while still supporting the substrate without bowing. In one embodiment, the substrate is kept planar, while in other embodiments it may be desirable to vary the protrusion height, or alternately the top surface of the substrate support (with the protrusions of equal height), to properly support a curved substrate. Another factor is avoiding sharp points that could cause local anomalies in the electric field. Too large a spacing can also affect the movement of charge during dechucking, causing damage.

It has been determined that an optimum center-to-center spacing of the protrusions is in the range of 100–300 mils, more preferably approximately 300 mils. The size of the protrusions themselves is preferably between 10 and 150 mils, more preferably approximately 130 mils in diameter. Square protrusions are shown simply because of their ease in manufacture, and other shapes could be used as well. Annular shapes could be used, for example.

In the embodiment shown, no openings for removing gas are shown in the outer peripheral region, although this can be provided in an alternative embodiment. The control of helium pressure can be done either by providing high or low pressure helium, or by more pumping through a vacuum pump. Similarly, for the central region, the pressure can be controlled in either of these ways or through a combination of both. The placement of the helium source as a ring near the edges in combination with a vacuum near the middle of the support provides an additional pressure gradient within the central region, decreasing towards the center. An alternate embodiment of the present invention thus provides a coarse adjustment of the heat transfer through the two pressure zones, with a fine tuning occurring through the placement of the helium inlet and vacuum outlets in the central portion. In alternate embodiments, more than one zone could be used for finer adjustments, with the trade off of requiring more hardware.

Figure 4:
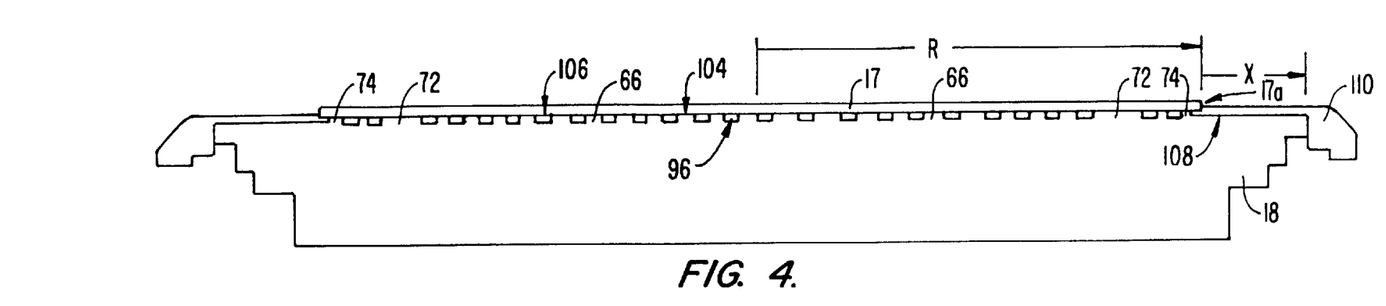
FIG. 4 is a simplified cross-sectional diagram (not drawn to scale) illustrating an exemplary substrate support in accordance with the present invention, with a substrate positioned thereon.
Figure 5:
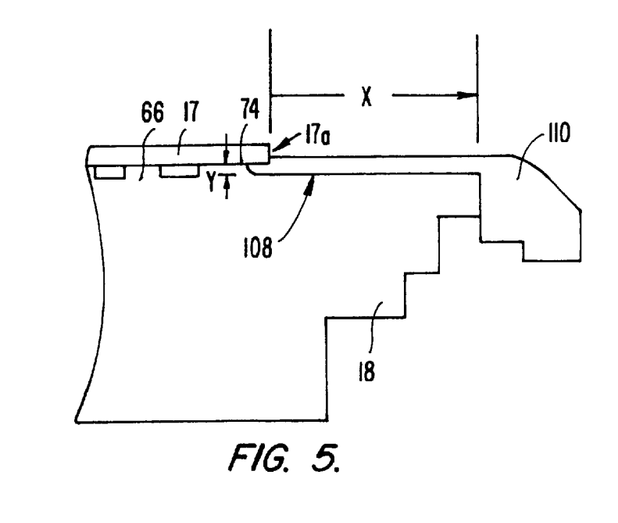
FIG. 5 is a simplified cross-sectional diagram (not drawn to scale) illustrating an arrangement of an edge portion of the substrate support of FIG. 4.

FIG. 4 is a simplified cross-sectional view of the embodiment of the electrostatic chuck shown in FIG. 3, supporting a substrate 17. FIG. 5 shows an enlarged cross-sectional view of an edge portion of the substrate support.

FIG. 4 shows that support 18 comprises a central conductive material 18a coated with a dielectric material 18b, such that the application of bias to support 18 creates a unitary electrode. FIG. 4 further shows the multiple protrusions 66 and also shows the inner seal 72 and the outer seal 74. Also as shown in FIG. 4, a temperature sensor 96 can be placed in the space between top surface 104 of the electrostatic chuck 20 and the substrate 17. The temperature of the substrate can thus be inferred from the sensor 96.

Particular aspects of the substrate support 18 and the system for supporting and holding the substrate within the processing chamber will now be described. Substrate support 18 includes an upper surface 104 including a central upper surface portion 106 and a peripheral upper surface portion 108. Central upper surface portion 106 underlies all but the edge 17a of substrate 17. Edges 17a of substrate 17 are in contact with notch 110a of process kit or shield 110 that is formed from a robust dielectric material.

Peripheral upper surface portion 108 extends a distance X past edge 17a of substrate 17. Peripheral upper surface portion 108 is recessed by a distance Y relative to central upper surface portion 106. Because of the lower disposition of peripheral upper surface portion 108 relative to central upper surface portion 106, substrate support 18 can be characterized as a "shoulder" or "step" configuration substrate support. One skilled in the art will recognize that the term "lower" refers to the relative location of peripheral upper surface portion 108 with respect to the central upper surface portion 106 and not to any other reference plane.

During processing of substrate 17, the surrounding environment may be highly corrosive due to the presence of plasma and reactive species. Accordingly, shield 110 may overlie the peripheral upper surface portion 108 of support 18, such that the recessed shoulder portion of support 18 is blocked from exposure to corrosive plasma present in the processing chamber. Shield 110 may potentially be formed from a variety of robust dielectric materials, for example a ceramic. The thickness and width of shield 110 is determined by the corresponding dimensions of the peripheral upper surface 108 of support 18. The composition of shield 110 is such that the electric field near the edges of the support is not substantially altered relative to the electric field at central portions of the support which are not overlaid by the shield.

The presence of shield 110 should not interfere with positioning of substrate 17 on central upper surface portion 106. For example, shield 110 can be configured such that its top surface 112 is level with central upper surface portion 106. In fact, as shown in FIG. 4, shield 110 may include notch 100a for receiving and supporting edges 17a of substrate 17.

As just described, upper surface 104 is configured to extend beyond substrate edge 17a when substrate 17 is positioned on substrate support 18. Specifically, the extension of peripheral upper surface portion 108 of the support helps to ensure the presence of a substantially homogenous electric field over the wafer edge relative to the center of the wafer. That is, extension of the peripheral portion of the substrate support relocates to beyond the substrate edge the changed direction and magnitude of the electric field associated with the electrostatic chuck edge. The shallow recess distance of the peripheral upper surface portion enables the process kit to contact and support the wafer edge, while minimizing the change in electric field associated with the distance between the chuck and the plane of the supported substrate.

This extension of upper substrate surface 104 beyond the outer edge of the substrate may provide at least two potential benefits during HDP-CVD processing of the substrate. First, it reduces the deposition nonuniformity and gap fill limitations that may be associated with conventional substrate supports. These effects are caused by discontinuities, curvature or termination of the bias electric field at the outer edge of substrates positioned on conventional substrate supports (referred to as the "edge effect" or "electric field edge effect") that are attributable to proximity of the changed shape at the edge of the conventional support.

This reduction in the edge effect is accomplished in substrate supports according to the present invention by providing an essentially uniform bias RF electric field over the entire substrate, including its edges. As a consequence of this configuration, the RF electrode portion of the substrate support and hence the bias RF electric field is larger than the substrate's diameter. This reduction in the edge effect can improve HDP-CVD processing performance (e.g., gap fill performance) near the outer edge of the substrate (e.g., within 25 mm of the substrate outer edge).

Second, it is postulated without being limiting, that the extension of the upper support surface, and thus the bias RF electric field, beyond the outer edge of the substrate also provides a "focusing effect." In this focusing effect, a larger percentage of ions traveling toward the substrate, as the result of the presence of the bias electric field, are traveling perpendicular (i.e., vertically) to the substrate's upper surface as compared to the circumstance of a conventional substrate support without such an extension of the upper surface. In other words, the angular distribution of the ions is forced toward the preferred vertical direction. Consequently, more ions are available for filling narrow, high aspect ratio features (such as trenches) on the substrate, thereby improving process performance. This focusing effect is evident in improved gap fill process performance across the entire substrate, not only near the outer edge of the substrate.

The magnitude of extension and recess distances X and Y, respectively, of FIGS. 4 and 5 may be determined to optimize uniformity of the electric field existing over peripheral regions 17a of substrate 17 during processing. Specifically, upon application of a voltage to support 18, an electric field is created over upper surface 104 of support 18.

Figure 6:
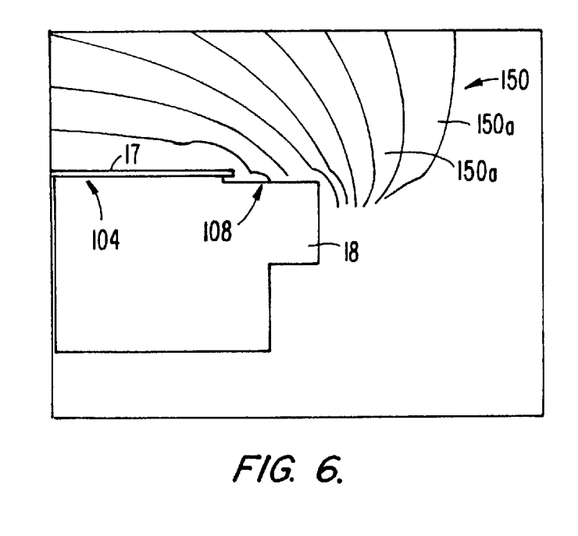
FIG. 6 is a simplified cross-sectional diagram (not drawn to scale) illustrating contours of the electrical field experienced by edge portions of the substrate supported in FIGS. 4 and 5.

FIG. 6 is a simplified cross-sectional diagram showing the contours 150a of this electric field 150, which generally conforms to the shape of support 18. Because peripheral upper surface 104 of support 18 extends distance X past substrate edge 17a, and because peripheral upper surface 104 of support 18 is recessed only a relatively shallow distance Y from the plane of the substrate, edge regions 17a of substrate 17 do not experience a sharp change in electric field associated with the approaching edge of the support. Instead, the change in electric field associated with the support edge is extended substantially beyond the substrate edge, which continues to experience a relatively uniform electric field. The uniformity in electric field conveyed by the extended support periphery ensures consistency of processing characteristics such as gap fill, which are affected by the magnitude and direction of the electric field that is present over the wafer.

Figure 7:
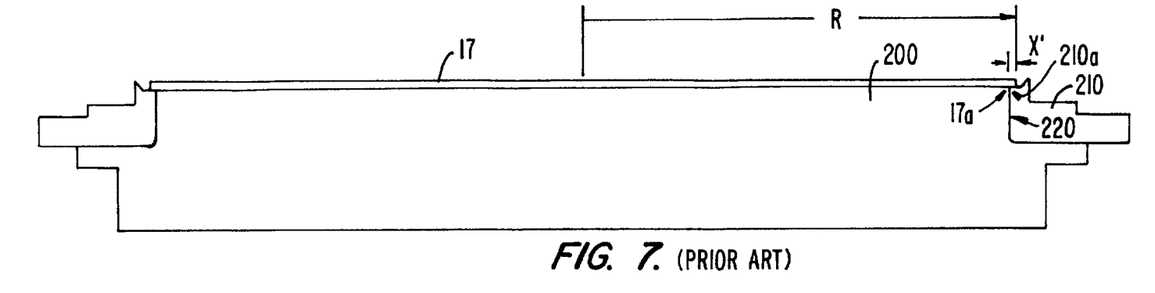
FIG. 7 is a simplified cross-sectional diagram (not drawn to scale) illustrating a conventional substrate support with a substrate positioned thereon.
Figure 8:
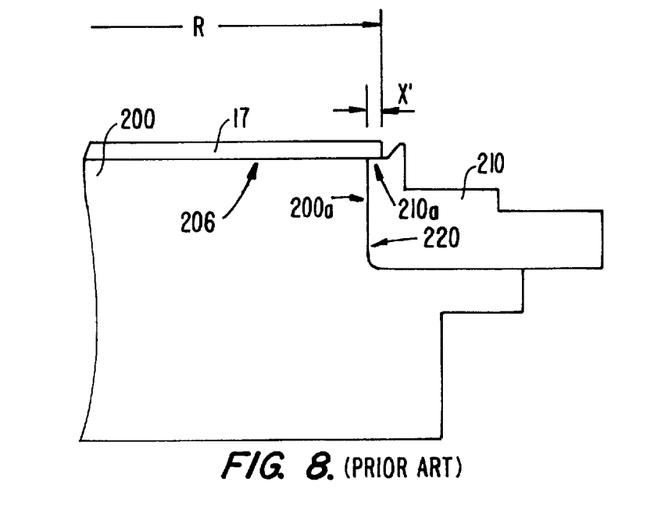
FIG. 8 is a simplified cross-sectional diagram (not drawn to scale) illustrating an enlargement of the edge portion of the conventional substrate support of FIG. 7.
Figure 9:
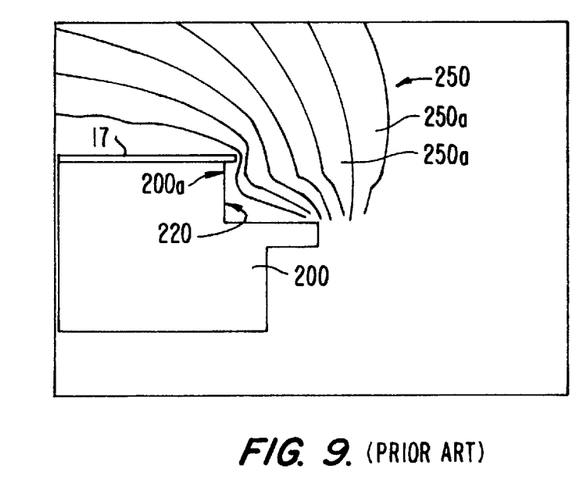
FIG. 9 is a simplified cross-sectional diagram (not drawn to scale) illustrating contours of the electrical field experienced by edge portions of the substrate supported in FIGS. 7 and 8.

The relatively uniform character of the substrate edge electric field provided by embodiments of substrate supports in accordance with the present invention can be contrasted with the substrate edge electric field provided by conventional supports. FIG. 7 shows a simplified cross-sectional view of a conventional substrate support. FIG. 8 shows an enlarged cross-sectional view of the edge of the conventional substrate support shown in FIG. 7. FIG. 9 is a simplified schematic diagram showing the contours of an electric field arising from application of a voltage to the conventional substrate support of FIGS. 7–8.

Conventional substrate support 200 includes an upper surface 204 including an upper surface portion 206. Upper surface, portion 206 underlies all but the edge 17a of substrate 17. Edges 17a of substrate 17 are in contact with notch 210a of process kit or shield 210. Shield 210 also overlies sides 220 of conventional support 200, which would otherwise be exposed to the corrosive plasma present in the processing chamber. Shield 210 may be formed from a variety of robust dielectric materials.

In contrast with the substrate support structure in accordance with the present invention, edge regions 200a of conventional support 200 fall off sharply from upper surface 206. In such conventional supports, the periphery of the support may be recessed from the plane of the wafer by a distance of 0.5" or greater, substantially altering the character of the corresponding electric field experienced by the edge of the substrate.

Specifically, FIG. 9 shows that the resulting contours 250a of the electrical field 250 conforming to the shape of the support also change abruptly at the substrate edge. This change in uniformity of the electrical field may give rise to corresponding disparities in process performance between the edge and center of the substrate.

It should be understood that various alternatives of the invention described herein may be employed. Thus, the particular dimensions of the substrate support, and in particular the extension distance and the recess distance of peripheral portions of the upper surface, is a function of the type of processing conducted using the substrate support.

For example, in one embodiment in accordance with the present invention, a support is designed for HDP-CVD processing of a dielectric layer upon a 200 mm diameter substrate. For this embodiment, a radial distance of the central upper portion is 3.887" (~96 mm), while the extension distance is 1.048" (~29 mm). Utilization of this embodiment of an extended substrate in accordance with the present invention provided noticeable benefits during HDP-CVD processing of a 200 mm diameter semiconductor substrate.

Moreover, an alternative embodiment of a substrate support utilizing a 25 mm extension provided an even more pronounced process benefit of a 70% reduction in the edge effect. Extensions greater than 25 mm are expected to provide equal or better benefits by maintaining at the substrate edge the uniform character of the electric field present at the center of the substrate.

In determining applicable extension distance for particular embodiments in accordance with the present invention, the desire for improvement in performance may need to be balanced against the increased size of the support, which may be constrained by factors such as the size of the chamber and of other processing components. In addition, increase in the size of substrate support to achieve improved performance may also need to be balanced against costs associated with additional power required to operate the device at a predetermined power per unit area, and/or to produce an RF electric field of desired intensity. Such additional costs may include wear and tear on the process components due to the use of higher voltages.

For the specific embodiment of the HDP-CVD substrate support described above, the recess distance Y is 0.0540" (~0.128 mm). While the exact recess distance will vary according to the particular application for the support structure, it is envisioned that the recess distance Y will be less than approximately 0.1" (~3 mm).

In determining the applicable recess distance for particular embodiments in accordance with the present invention, improvement in substrate support performance may need to be balanced against the physical strength required for the shield structure occupying the recess during processing. An extremely shallow recess may require use of relatively thin shield, if the shield is to remain flush with the plane of the central upper surface of the wafer. Such a thin shield must endure the harsh conditions associated with plasma processing, without significant fracture or degradation. Other considerations for determining recess distance include the composition of the shield, and hence its permittivity to the electric field associated with the underlying periphery of the substrate support.

Figure 10:
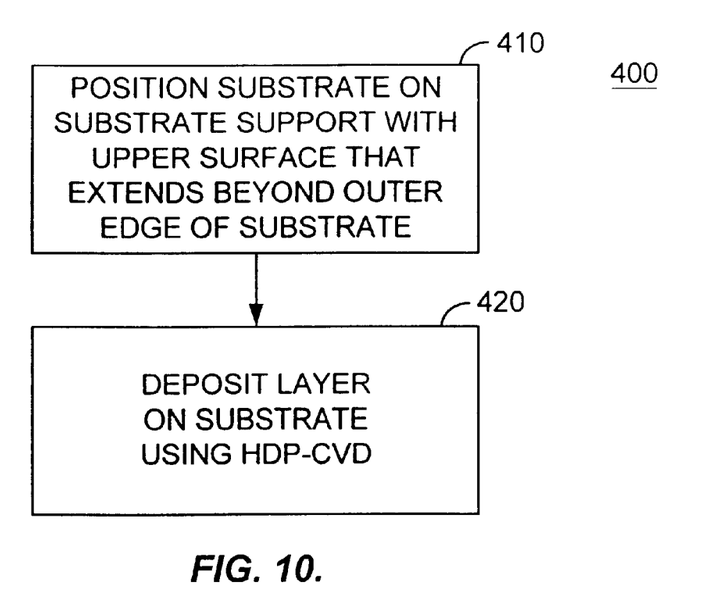
FIG. 10 is a flow diagram illustrating a sequence of steps in a process according to one exemplary embodiment of the present invention.

While the discussion so far has focused upon the structure of the substrate support itself, embodiments in accordance with the present invention also relate to methods utilizing this support structure. FIG. 10 is a flow diagram illustrating a sequence of steps in a process 400 for depositing a layer on a substrate (e.g., a semiconductor wafer) according to one embodiment of the present invention. Process 400 includes positioning a substrate on a substrate support, as set forth in step 410. The substrate support includes an RF electrode, which may be unitary a separate structure embedded within the support. An upper surface of the substrate support includes both a central upper surface portion and a peripheral upper surface, with the peripheral upper surface portion being disposed lower than the central upper surface portion. In addition, the upper surface extends beyond an outer edge of the substrate when the substrate is positioned on the substrate support Next, a layer (e.g., a dielectric layer or a polysilicon layer) is deposited on the substrate using a HDP-CVD technique, as set forth in step 420. Since the substrate support used in process 400 has an upper surface that extends beyond the outer edge of the substrate, it can be beneficial to increase the bias power and gas flow used in step 410 by, for example, 20% to 100% beyond that which would be used with a conventional substrate support.

Figure 11:
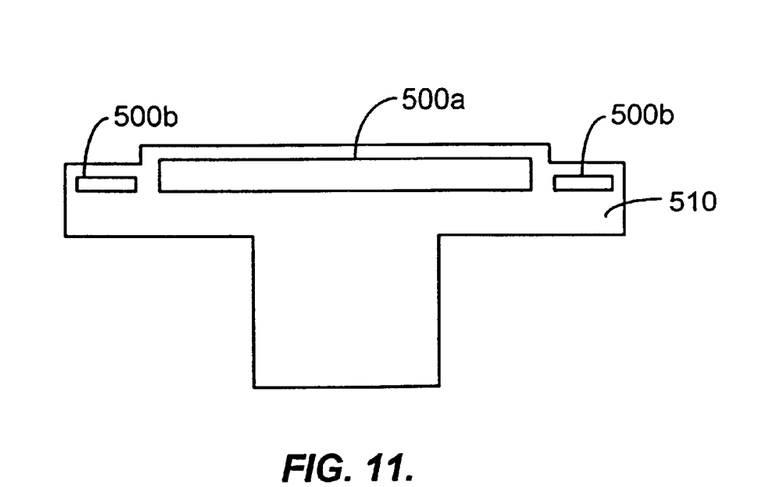
FIG. 11 is a cross-sectional diagram illustrating an alternative embodiment of a substrate support in accordance with the present invention utilizing an embedded electrode structure.

In addition, while the apparatuses and methods for supporting a semiconductor substrate during processing have been described in conjunction with a substrate support having a unitary electrode portion formed by electrically conducting core coated with a dielectric material, the present invention is not limited to this particular structure. In accordance with alternative embodiments of the present invention, a substrate support may comprise a separate conducting electrode portion embedded within a support formed from dielectric material. A cross-sectional view of such an alternative embodiment in accordance with the present invention is shown in FIG. 11, wherein central 500*a* and peripheral 500*b* portions of electrode 500 are embedded within a dielectric support 510.

While the apparatuses and methods for supporting a semiconductor substrate during processing have been described in conjunction with performance of HDP-CVD semiconductor fabrication processes, embodiments of the present invention are not limited to this particular application. Electrostatic chuck structures having extended, recessed peripheral upper surface portions can be used to support substrates during a variety of other types of fabrication processes, including but not limited to etching and sputtering.

Based on the above, it is intended that the following claims define the scope of the invention and that structures and methods within the scope of these claims and their equivalents be covered thereby.

What is claimed is:

1. A substrate support for a semiconductor processing apparatus adapted to process a substrate, the substrate support comprising,
   a conductive portion for providing an electrical field to a supported substrate; and
   a dielectric upper surface including,
      a central upper surface portion configured to contact a center of the substrate, and
      a peripheral upper surface portion recessed from a plane of the supported substrate by a distance of 3 mm or leas, the peripheral upper surface portion extending beyond an edge of the supported substrate to provide a homogenous electrical field at an edge of the substrate relative to a center of the substrate.

2. The substrate support of claim 1, wherein an edge of the substrate extends beyond the central upper surface portion and overlies a part of the peripheral upper surface portion.

3. The substrate support of claim 1 further including a shield covering the peripheral upper surface portion and occupying a space created by the recess in the peripheral upper surface portion.

4. The substrate sport of claim 3, wherein a top surface of the shield is level with the central upper surface portion and includes a notch for receiving the substrate edge.

5. The substrate support of claim 3, wherein the shield is formed from a ceramic material.

6. The substrate support of claim 1, wherein the substrate support is configured to receive a semiconductor wafer.

7. The substrate support of claim 1, wherein the substrate support comprises a unitary electrostatic chuck.

8. The substrate support of claim 1, wherein the supported substrate has a diameter of 200 mm and the peripheral upper surface portion extends beyond the outer edge of the substrate by at least 10 mm.

9. The substrate support of claim 1, wherein the supported substrate has a diameter of 300 mm and the peripheral upper surface extends beyond the outer edge of the substrate by at least 25 mm.

10. The substrate support of claim 1, wherein the conducing RF electrode portion comprises a bias cathode portion of a high density plasma chemical vapor deposition (HDP-CVD) apparatus.

11. The substrate support of claim 1, wherein the conducing RF electrode portion comprises a bias cathode portion of a plasma etching apparatus.

12. The substrate support of claim 1, wherein the upper surface extends beyond the outer edge of the substrate by a distance sufficient to induce a focusing effect during substrate processing.

13. An apparatus for performing high density plasma chemical vapor deposition of material upon a substrate, tie apparatus comprising:
  a chamber defining a plasma processing region therein, the chamber including a bottom, a side wall, and a dome disposed on top of the side wall, the dome having a dome top and having a side portion defining a chamber diameter;
  a vacuum system including a pump for evacuating the chamber;
  a processing gas source in fluid communication with the chamber;
  top RF coil disposed above the dome top;
  a side RF coil disposed adjacent the side portion of the dome;
  a substrate bias source;
  a substrate support positioned within the processing chamber, the substrate support including,
    a conductive portion configured to receive a bias from the substrate bias source and to apply an electrical field over a supported substrate; and
    a dielectric upper surface including a central upper surface portion configured to contact a center of the substrate, and a peripheral upper surface portion recessed from a plane of the supported substrate by a distance of 3 mm or less, the peripheral upper surface portion extending beyond an edge of the supported substrate, to provide a homogenous electrical field at an edge of the substrate relative to a center of the substrate.

14. The apparatus of claim 13, wherein the substrate comprises a 200 mm diameter wafer and the peripheral upper surface portion of the support extends beyond the outer edge of the substrate by about 10 mm.

15. The apparatus of claim 13, wherein the substrate comprises a 300 mm diameter wafer and the peripheral upper surface portion of the support extends beyond the outer edge of the substrate by about 25 mm.

16. The apparatus of claim 13, wherein the central upper surface portion includes a plurality of raised protrusions defining, with a backside of the supported substrate, a plurality of channels, the channels fluidly coupled to a gas source to delivery a gas to control a temperature of the substrate.

17. The apparatus of claim 13, further comprising a shield positioned over the peripheral upper surface portion and supporting the substrate edge.

* * * * *